(12) United States Patent
Angelopoulos et al.

(10) Patent No.: US 6,447,914 B1
(45) Date of Patent: Sep. 10, 2002

(54) METHOD OF UNIFORMLY DEPOSITING SEED AND A CONDUCTOR AND THE RESULTANT PRINTED CIRCUIT STRUCTURE

(75) Inventors: Anastasios P. Angelopoulos; Gerald W. Jones, both of Apalachin; Luis J. Matienzo, Endicott; Thomas R. Miller, Endwell; William D. Taylor, Endicott, all of NY (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 09/609,386

(22) Filed: Jul. 3, 2000

Related U.S. Application Data

(60) Division of application No. 09/065,668, filed on Apr. 23, 1998, now Pat. No. 6,136,513, which is a continuation-in-part of application No. 08/874,641, filed on Jun. 13, 1997, now Pat. No. 5,997,997.

(51) Int. Cl.[7] ............................................. B32B 27/38
(52) U.S. Cl. ....................... 428/414; 428/413; 430/315
(58) Field of Search ................................ 428/413, 414, 428/416, 418; 430/315

(56) References Cited

U.S. PATENT DOCUMENTS

| | | | | |
|---|---|---|---|---|
| 4,969,979 | A | * 11/1990 | Appelt et al. | ................. 204/15 |
| 5,015,339 | A | * 5/1991 | Pendleton | .................... 204/15 |
| 5,866,237 | A | * 2/1999 | Angelopoulos et al. | ..... 428/209 |

* cited by examiner

Primary Examiner—Robert Dawson
Assistant Examiner—Michael Feely
(74) Attorney, Agent, or Firm—Connolly Bove Lodge & Hutz; Lawrence R. Fraley

(57) ABSTRACT

The present invention comprises a method of making a circuitized structure. The method comprises the steps of providing a substrate coated with a polymeric dielectric layer, treating the substrate with alkali, baking the substrate to modify the surface of the polymeric dielectric layer, applying a seed layer to the polymeric dielectric layer and applying conductive layer to the seed layer. The invention also comprises a printed circuit structure produced by the method of the present invention.

15 Claims, 1 Drawing Sheet

METHOD OF UNIFORMLY DEPOSITING SEED AND A CONDUCTOR AND THE RESULTANT PRINTED CIRCUIT STRUCTURE

CROSS REFERENCE TO COPENDING APPLICATION

This is a divisional of Application Ser. No. 09/065,668, filed Apr. 23, 1998, now U.S. Pat. No. 6,136,513, which is a continuation-in-part of Application Ser. No. 08/874,641, filed Jun. 13, 1997, now U.S. Pat. No. 5,997,997.

FIELD OF THE INVENTION

The invention relates to electronic packages such as chip carriers, printed circuit boards, printed circuit cards, accessory cards, and the like, and more particularly to such electronic packages of the organic type where a conductive layer, as a copper conductive layer, is deposited atop a seed layer.

BACKGROUND OF THE INVENTION

In one known process for fabricating circuitized structures, such as printed circuit boards, electroless additive plating is employed to plate metal, such as copper, to form circuitization onto the structure's dielectric surfaces. In forming such circuitization for these structures, the structure's surface may be photoimaged dielectric, having through holes photoimaged in the dielectric, and may be blanket-coated with seed. Next, a photoresist may be blanket-coated onto the seed layer and photoimaged in a pattern corresponding to the designed circuitization pattern. The line channels may then be developed away, and the structure immersed in an electroless plating bath so that copper may be additively plated in the channels atop the exposed seed; copper may simultaneously be plated into the through holes. The photoresist may then be stripped, leaving circuitization atop the dielectric. The seed which does not have copper deposited thereon, may then be removed. If desired, the copper may then be further plated.

Conventional seeding and electroless plating circuitization methods often suffer from excessive seed deposition; the presence of excessive seed on a circuit board leads to leakage shorts and poor adhesion of the photoresist onto the seed due to a non-homogeneous surface. Excess seed can also lead to unwanted metal plating in subsequent steps.

Conventional seeding and electroless plating method can also suffer from non-uniform electroless plating within the circuitization line channels, resulting in unwanted skip plating or defects.

It is, therefore, desirable to provide a method for depositing seed which does not result in excessive seed deposition or non-uniform electroless plating within the circuitization line channels. Circuit boards produced with this method should have lower levels of plating circuit line defects and shorts. This would also reduce the need for excessive inspection and improve outgoing product quality levels.

OBJECTS AND SUMMARY OF THE INVENTION

Accordingly, it is an object of this invention to enhance the art of seeding and electroless plating technology.

It is another object of this invention to provide a novel method for both reducing and more uniformly distributing the amount of seed deposited on a dielectric substrate, thereby depositing electroless plating in a very uniform fashion.

It is yet another object of this invention to provide a circuitized substrate for use in manufacture of a multilayer printed circuit board, the circuitized substrate having a reduced level of leakage shorts and skip plating defects (i.e. voids or pits).

This invention is adaptable to mass production, improves overall product quality and reduces the cost of manufacturing such products.

According to one aspect of this invention there is provided a method of making a circuitized substrate, the method comprising the steps of providing a substrate having a dielectric layer, the dielectric layer having a first external surface, treating the first external surface of the dielectric layer with alkali to promote subsequent uniform deposition of a polyelectrolyte thereon, heating the substrate so as to oxidize the first external surface of the dielectric layer, depositing a polyelectrolyte layer onto the alkali treated and heated dielectric layer on the external surface of the dielectric layer, depositing a seed layer on the polyelectrolyte layer, and providing a layer of circuitry on the seed layer.

According to another aspect of this invention, there is provided a circuitized substrate comprising a substrate having a dielectric layer and a first external surface, with at least a portion of the first external surface being oxidized, a polyelectrolyte layer on the oxidized portion of the first external surface of the dielectric layer, a seed layer on the polyelectrolyte layer, and a circuitized conductive layer on the seed layer.

BEST MODE FOR CARRYING OUT THE INVENTION

Figure 1:
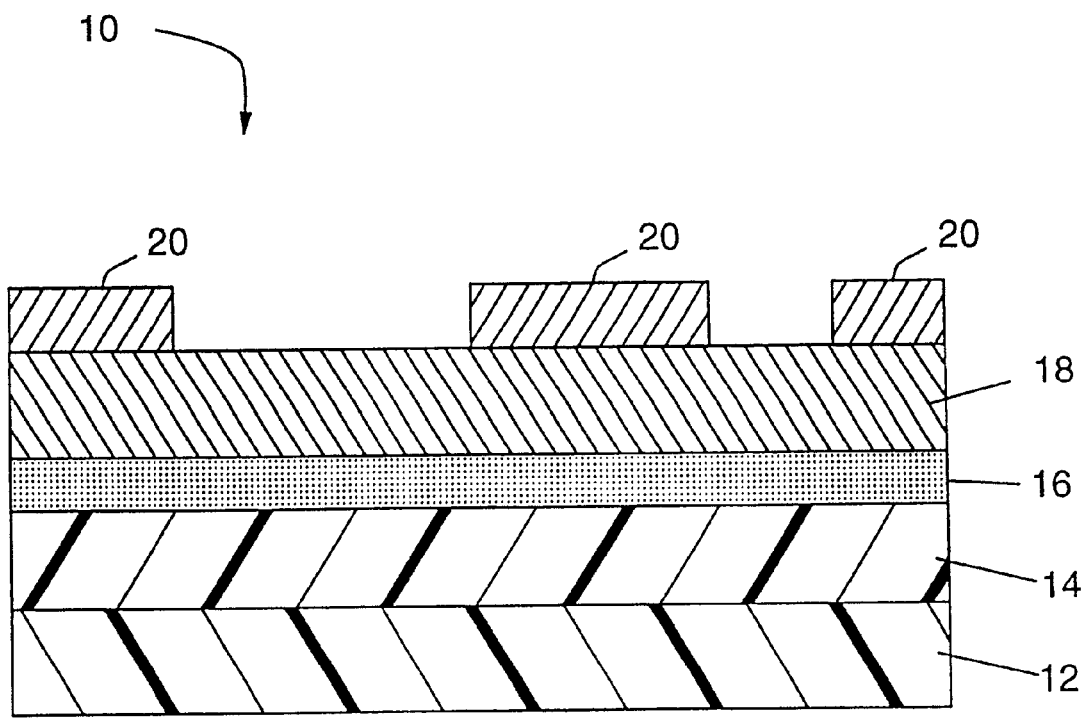
FIG. 1 is a circuit board having a modified alkali treated and baked dielectric layer having polymeric surfactant and seed deposited thereon in accordance with one embodiment of the invention.

The present invention provides a method of both reducing and more uniformly depositing the amount of seed deposited on polymeric dielectric surfaces and improving the uniformity of the subsequent plating deposition. The method comprises the step of providing a substrate which includes a first external surface coated with a polymeric dielectric layer. Preferably, the polymeric dielectric surface is roughened, such as for example, by using a swelling agent, a hole cleaning operation, an oxidizing agent, a plasma treatment, a vapor blast, mechanical abrasive operation, or chemically roughening with etchants such as chrome sulfuric acid or permanganate. Next the substrate with the polymeric dielectric layer is treated with an alkali, such as an alkaline solution, to promote subsequent uniform deposition of a polyelectrolyte and then heated or baked.

The alkaline solution treatment can be performed by contacting the polymeric dielectric layer with a solution of potassium, ammonium or sodium hydroxide having a pH value of about 10 to about 14. Preferably the treatment is performed with a solution of pH about 13. The alkaline solution treatment can be performed at a temperature of about 70° F. (Fahrenheit) to about 200° F. for about 1 minute to about 30 minutes, with the preferred treatment performed at about 150° F. for about 15 minutes to about 20 minutes. The alkaline solution treatment functions to improve uniformity of the surface of the polymeric dielectric in preparation for subsequent polyelectrolyte deposition by increasing the number of hydroxyl sites available for subsequent reaction with sulfur moieties present in the polymeric dielectric layer during the drying and/or baking step. The substrate is then baked for a time period and at a temperature sufficient to modify (react the hydroxyl sites with the sulfur moieties) the surface of the polymeric dielectric. The bake temperature can be about 20° Celsius (C) to about 210° C. For the preferred polymeric dielectric the bake temperature is from about 110° C. to about 190° C., preferably about 180° C.

Bake temperatures should not exceed the temperature at which the polymeric dielectric layer begins to degrade; for example, for the preferred polymeric dielectric, the bake temperature preferably does not exceed about 210° C. Temperatures above about 210° C. for about one hour may lead to cracking, which is detectable under scanning electron microscopy. Therefore, such temperatures are less preferred. For the preferred polymeric dielectric, good results have been obtained by baking the polymeric dielectric at about 180° C. for about 2 hours. The bake can be performed in a low oxygen environment, such as under a 100% nitrogen atmosphere, or in an oxygen atmosphere or in air. The bake step is performed in conventional ovens, such as—for example, vacuum, static, or convection ovens with or without gas purge, such as oxygen or nitrogen.

The substrate is next treated with a polymeric surfactant which is capable of hydrogen bonding to weak acidic groups on the surface of the polymeric dielectric. Preferably, the polymeric surfactant is a cationic polyelectrolyte, more preferably a polyelectrolyte having amide groups, such as for example cationic polyacrylamide or cationic polyamidoamine. The polymeric surfactant has a molecular weight of from about $10^5$ to about $10^7$, preferably about $10^6$. A suitable cationic polyacrylamide polyelectrolyte is available under the Trademark name "Polytec" marketed by Polytec Incorporated; a suitable cationic polyamidoamine polyelectrolyte is available under tradename "Cartaretin" from Sandoz Chemical Company. After the baked dielectric surface is treated with the polymeric surfactant, the seed is then applied as a blanket layer to the surface of the polymeric dielectric by conventional techniques, such as by dipping or depositing the substrate in a conventional colloidal seed bath such as, for example, a Pd/Sn (Palladium/Tin) bath. Suitable seed is negatively charged metal in colloidal form such as, for example, colloidal gold, palladium, or nickel.

Conventional photoresist or another photoimageable polymer layer, is then applied over the seed layer and patterned, preferably photoimaged, using conventional techniques. The photoresist is developed to remove the photoresist in areas where. circuitization lines are desired. Then a conductive layer, such as a metal, is electrolessly plated to the seeded areas which are not covered with the photoresist, using conventional techniques such as by depositing the substrate in a conventional electroless plating bath. The photoresist is then typically stripped, using conventional stripping agents. Thereafter, the seed is also stripped if desired. An advantage of the present method that less but more uniform seed is deposited. Another advantage is that it results in a more uniform and defect free conductive deposit (less voids or pits). The result is an overall better quality circuitized substrate.

Preferably the polymeric dielectric layer contains at least trace sulfur atoms or sulfur moieties. In the preferred embodiments, sulfur moieties are provided on the surface of the dielectric by a cationic photoinitiator present in the polymeric dielectric. Even if substantially all of the photoinitiator is consumed during a photoimaging step, some sulfur moieties remain in the photoimaged polymeric dielectric.

Preferably, the polymeric dielectric is an organic polymeric dielectric having hydroxyl groups, capable of being activated by treatment with an alkaline solution. More preferably the polymeric dielectric layer comprises epoxy resin. Preferably the polymeric dielectric layer contains a cationic photoinitiator having sulfur moiety such as a complex triarylsulfonium hexafluoroantimonate salt. A suitable complex triarylsulfonium hexafluoroantimonate salt cationic photoinitiator is commercially available under the tradename UVI Cyracure® 6974 available from Union Carbide Company.

The preferred polymeric dielectric has solids which are comprised of from about 10% to about 80% (preferably about 30%) of phenoxy polyol resin which is the condensation product of epichlorohydrin and bisphenol A, having a molecular weight of from about 40,000 to about 130,000; from about 20% to about 90% (preferably about 25%) of an epoxidized multifunctional bisphenol A formaldehyde novolac resin having a molecular weight of from about 4,000 to about 10,000 (preferably about 5,000 to about 7,000); from 0% to about 50% and preferably about 45%, of a halogenated, preferably brominated, diglycidyl ether of bisphenol A having a molecular weight of from about 600 to about 2,500; and from about 0.1 to about 15 parts (preferably about 5 parts) by weight of the total resin weight as cationic photoinitiator. The solvent component of the dielectric film preferably is comprised of propyleneglycol monomethyl ether acetate and about 0% to less than about 10% propylene carbonate. The propylene carbonate being the preferred carrier for the preferred photoiniatator.

The phenoxy polyol resin has an epoxide value of from about 0.001 to about 3 (preferably about 0.03) equivalents per kilogram (kg); a weight per epoxide of from about 10,000 to about 60,000 (preferably about 37,000); and a glass transition temperature of from about 80° C. to about 150° C. (preferably about 98° C).

The multifunctional epoxy bisphenol A formaldehyde novolac resin has an epoxide value of from about 1 to about 10 (preferably about 4.7) equivalents per kg, a weight per epoxide of from about 180 to about 300 (preferably about 215), and a melting point of from about 60° C. to about 150° C. (preferably about 82° C.).

The diglycidyl ether of the halogenated bisphenol A, has an epoxide value of from about 0.1 to about 5 (preferably about 1.5) equivalents per kg, a weight per epoxide of from about 200 to about 1000 (preferably about 675), and a melting point of from about 70° C. to about 150° C. (preferably about 97° C.).

A suitable phenoxy polyol resin is available under the tradename "PKHC" available from Phenoxy Resin Associates. A suitable octafunctional bisphenol A is available as tradename "Epon® SU8" from Shell Chemical Corporation. A suitable tetrabromobisphenol A is available as "Epon® 1183" from Shell Chemical Corporation.

It has been discovered that treatment with an alkali, such as an alkaline solution, followed by heating or baking of the polymeric dielectric surface modifies the surface of the dielectric so that when the dielectric surface is subsequently contacted with the polymeric surfactant (polyelectrolyte), a less and more uniform polymeric surfactant adheres to the treated and baked dielectric surface as compared to an untreated and unbaked dielectric surface. The result is that the surface has lesser amounts of polymeric surfactant disposed thereon and the polymeric surfactant layer is more uniform. Since the seed adheres to the polymeric surfactant deposited on the dielectric surface, by reducing the amount of polymeric surfactant on the dielectric surface and making it more uniform, the amount of seed is also reduced and deposited in a more uniform fashion. More specifically, it has been discovered that the amide groups in the polymeric surfactant bind to hydroxyl groups present on the surface of the polymeric dielectric. By treating the polymeric dielectric with an alkali as before the heating or baking step, it is believed that a more uniform number of hydroxl groups are made present on the surface of the polymeric dielectric than would otherwise be present without the alkali. This uniformity leads to more uniform subsequent deposition of polymeric surfactant, a more uniform deposition of seed, and a more uniform deposition of a conductive layer such as copper. Baking of the polymeric dielectric causes scavenging groups, such as sulfur containing moieties, present on the surface of the polymeric dielectric to more uniformly bind to the oxygen of the hydroxyl groups, so that such groups are less, and more uniformly available for binding to the polymeric surfactant. It has been discovered that the combination of alkali treatment followed by the baking prescribed in this invention is effective when the sulfur moieties are between 20 and 70 percent oxidized.

Minimal seed deposition coverage is not greater than about 11 micrograms per square centimeter ($\mu g/cm^2$) seed (preferably not more than about 9 $\mu g/cm^2$) as measured by electron microprobe analysis also referred to as "EMPA". Seed deposited in about 5 to about 7 $\mu g/cm^2$ will typically provide a monolayer of seed on the dielectric and is thus most desired. Less than about 4 $\mu g/cm^2$ coverage, as measured by "EMPA", of seed may result in non-uniform areas where seed is not deposited on the polymeric dielectric and thus is less desired because it could lead to skip plating defects.

As a result of the more uniform and reduced seed deposition resultant from the alkali treatment and the bake step of this invention, the electrolessly and/or electrolytically plated metal features such as circuit lines display good line resolution (i.e. minimal circuit line defects).

As shown in FIG. 1, a circuitized structure 10 produced by the method of the invention is comprised of substrate 12, alkali treated and baked polymeric dielectric layer 14 disposed on substrate 12, polymeric surfactant 16 disposed on alkali treated and baked polymeric dielectric layer 14, seed 18 dispose on at least a portion of polymeric surfactant 16, and a circuitized conductive layer 20 (preferably copper) disposed on and adhering to at least a portion of seed layer 18.

The following comparative examples are presented to illustrate the invention. In Example 1, no alkali treatment is applied.

EXAMPLE 1

A polymeric dielectric layer (photoimageable dielectric) was coated onto glass/epoxy laminates containing a tetrabromo bisphenol A epoxy resin available as 8213 resin from Ciba Geigy Incorporated. The photoimageable dielectric has solids which comprise about 30% of "PKHC", a phenoxy polyol resin; about 25% of Epirez SU-8, an epoxidized multifunctional bisphenol A formaldehyde novolac resin; about 45% of "Epon® 1183", a diglycidyl ether of tetrabromobisphenol A, and about 5 parts, by weight of the total resin weight of UVE 1014, a triarylsulfonium hexafluoroantimonate salt cationic photoinitiator.

The laminate coated on both sides with a photoimageable dielectric surface was then prepared by roughening and then baked in air at about 180° C. for about 2 hours. The laminate was then immersed in a cationic polyacrylamide polyelectrolyte solution from "Polytec" so as to coat both sides. A cationic polyamidoamine polyelectrolyte can also be used. Next, the laminate was blanket-coated with a Pd/Sn seed by immersing the substrate in a seed bath solution containing about 1.5 g/l (grams/liter) $PdCl_2$ (palladium chloride) and about 90 g/l $SnCl_2$ (stannous chloride). The laminate was then removed to determine the seed coverage on both front and back using electron microprobe analysis. These results can be found below in Table 1.

TABLE 1

|  | FRONT | BACK |
|---|---|---|
| Seed Deposition by Microprobe ($ug/cm^2$ Pd) | 10.2 +/− 0.5 | 11.0 +/− 0.2 |

Copper was then plated on both sides of the coated laminate by coating the palladium-tin seeded surfaces with a commercially available photoresist such as T168 from E.I. Dupont de Nemours and Company, photopatterning the photoresist to remove photoresist in the areas where circuit lines were desired, immersing the laminate in an electroless copper plating bath, and stripping the photoresist.

In this example of circuitized substrate manufacturing utilizing a bake step with no prior alkali treatment, occasional voiding (pits) was present on the front of the prepared laminate and extensive and large voiding was present on the back side of the prepared laminate.

It is desirable to eliminate the obvious front to back differences in pitting and most desirable to eliminate the pitting altogether. This will be illustrated in Example 2 below where an alkali treatment step was added before the bake step in accordance with the unique aspects of the invention.

EXAMPLE 2

The laminate of Example 1, prior to the bake step, was soaked for about 20 minutes in hot alkaline solution having a pH of about 13 and a temperature of about 150° F. The soak was followed by the bake step of Example 1 and subsequent treatment and circuitization steps. Microprobe results of the average seed concentration before circuitization are illustrated in Table 2.

TABLE 2

|  | FRONT | BACK |
|---|---|---|
| Seed Deposition by Microprobe ($ug/cm^2$ Pd) | 7.1 +/− 0.2 | 6.6 +/− 0.2 |

Significantly, substantially no pitting was found on either side. Such an elimination of front and back pitting results in a product having exceptional circuit line quality.

While there have been described what are at present considered the preferred embodiments of the invention, it will be obvious to those skilled in the art that various changes and modifications may be made therein without departing from the scope of the invention as defined by the appended claims.

What is claimed is:

1. A circuitized substrate comprising:
   a substrate having a dielectric layer, said dielectric layer having a first external surface, at least a portion of said first external surface being oxidized;

a polyelectrolyte layer on said oxidized portion of said first external surface of said dielectric layer;

a seed layer on said polyelectrolyte layer; and a circuitized conductive layer on said seed layer, and wherein said dielectric layer comprises an epoxy resin including: a phenoxy polyol resin, which is the condensation product of an epihalohydrin and bisphenol A or an epoxidized octafunctional bisphenol A formaldehyde novolac resin.

2. The circuitized substrate of claim 1, wherein said epoxy resin further comprises hydroxl groups.

3. The circuitized substrate of claim 1, wherein said epoxy resin further comprises a cationically photoinitiated photoresist.

4. The circuitized substrate of claim 1, wherein said epoxy resin further comprises an epoxidized glycidyl ether of tetrabromo bisphenol.

5. The circuitized substrate of claim 1, wherein said epoxy resin contains sulfur moieties.

6. The circuitized substrate of claim 5, wherein said sulfur moieties are between 20 and 70 percent oxidized.

7. The circuitized substrate of claim 1, wherein said polyelectrolyte layer comprises amide groups.

8. The circuitized substrate of claim 7, wherein said polyelectrolyte is selected from the group consisting of cationic polyacrylamide and cationic polyamidoamine.

9. The circuitized substrate of claim 1 wherein said seed layer comprises palladium-tin.

10. The circuitized substrate of claim 9, wherein said palladium-tin seed is present in an amount greater than 0 $\mu g/cm^2$ to about 9 $\mu g/cm^2$.

11. The circuitized substrate of claim 9, wherein said palladium-tin seed is present in the amount of about 5 $\mu g/cm^2$ to about 7 $\mu g/cm^2$.

12. A circuitized substrate comprising:

a substrate having a dielectric layer, said dielectric layer having a first external surface, at least a portion of said first external surface being oxidized;

a polyelectrolyte layer on said oxidized portion of said first external surface of said dielectric layer;

a seed layer comprising palladium-tin on said polyelectrolyte layer; and a circuitized conductive layer on said seed layer; and wherein said palladium-tin seed is present in an amount greater than 0 $\mu g/cm^2$ to about 9 $\mu g/cm^2$.

13. The circuitized substrate of claim 12, wherein said palladium-tin seed is present in the amount of about 5 $\mu g/cm^2$ to about 7 $\mu g/cm^2$.

14. The circuitized substrate of claim 12, wherein said polyelectrolyte layer comprises amide groups.

15. The circuitized substrate of claim 12, wherein said polyelectrolyte is selected from the group consisting of cationic polyacrylamide and cationic polyamidoamine.

* * * * *